US006358672B2

(12) United States Patent
Jeoung et al.

(10) Patent No.: US 6,358,672 B2
(45) Date of Patent: Mar. 19, 2002

(54) METHOD OF FORMING SEMICONDUCTOR DEVICE PATTERN INCLUDING CROSS-LINKING AND FLOW BAKING A POSITIVE PHOTORESIST

(75) Inventors: Gyu-chan Jeoung; Kwang-seok Choi; Jin-hang Jung; Young-sun Kim, all of Kyungki-do; Hong Lee, Seoul; Hoe-sik Chung, Kyungki-do; Sung-ho Lee, Kyungki-do; Hun-hwan Ha, Kyungki-do, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/192,000

(22) Filed: Nov. 16, 1998

Related U.S. Application Data

(63) Continuation-in-part of application No. 09/110,964, filed on Jul. 7, 1998, now abandoned.

(30) Foreign Application Priority Data

| Feb. 5, 1998 | (KR) | ............................................. 98-3252 |
| Mar. 24, 1998 | (KR) | ............................................. 98-10172 |
| Apr. 17, 1998 | (KR) | ............................................. 98-13856 |
| Jul. 2, 1998 | (KR) | ............................................. 98-26680 |
| Aug. 3, 1998 | (KR) | ............................................. 98-31545 |

(51) Int. Cl.$^7$ ................................................. G03C 5/56
(52) U.S. Cl. ........................ 430/311; 430/328; 430/330
(58) Field of Search .............................. 430/311, 328, 430/330

(56) References Cited

U.S. PATENT DOCUMENTS

| 4,567,132 A | * | 1/1986 | Fredericks et al. ......... 430/312 |
| 4,775,609 A | * | 10/1988 | McFarland ................... 430/325 |
| 4,935,334 A | * | 6/1990 | Boettiger et al. ........... 430/322 |
| 5,096,802 A | * | 3/1992 | Hu ............................. 430/328 |
| 5,210,000 A | * | 5/1993 | Thackeray et al. ......... 430/165 |
| 5,348,835 A | * | 9/1994 | Oba et al. ................... 430/192 |
| 5,362,600 A | * | 11/1994 | Sinta et al. ................. 430/192 |
| 5,380,609 A | * | 1/1995 | Fujita et al. ................... 430/5 |
| 5,567,570 A | * | 10/1996 | Rostoker et al. ........... 430/311 |
| 5,614,352 A | * | 3/1997 | Rahman ................... 430/270.1 |
| 5,648,195 A | * | 7/1997 | Sebald et al. .............. 430/170 |
| 5,648,198 A | * | 7/1997 | Shibata ....................... 430/296 |
| 5,725,971 A | * | 3/1998 | Moriuchi et al. .............. 430/5 |
| 5,843,319 A | * | 12/1998 | Przybilla et al. ............ 210/668 |
| 5,892,095 A | * | 4/1999 | Hada et al. ................. 558/388 |
| 5,968,712 A | * | 10/1999 | Thackeray et al. ......... 430/326 |
| 6,121,158 A | * | 9/2000 | Benchikha .................. 438/766 |
| 6,207,357 B1 | * | 3/2001 | Krauth ....................... 430/327 |

* cited by examiner

*Primary Examiner*—Janet Baxter
*Assistant Examiner*—Barbara Gilmore
(74) *Attorney, Agent, or Firm*—Volentine Francos, PLLC

(57) ABSTRACT

There are provided a semiconductor device fabrication system for carrying out a UV-bake on a photoresist pattern in the semiconductor device pattern formation, a method of forming a semiconductor device pattern using the same, and a photoresist formed thereby. The semiconductor device fabrication system includes a photoresist coating unit coating a wafer with a specific photoresist; a developing unit forming a photoresist pattern on the wafer coated with the photoresist; and a cross-linking unit cross-linking the photoresist pattern to provide a stabilized flow during the flow process for the photoresist pattern. The method of forming a semiconductor device pattern includes: coating a wafer with a photoresist; aligning a photo mask on the photoresist, and carrying out an exposure; forming a photoresist pattern on the wafer; carrying out a cross-linking of the photoresist pattern; and carrying out a flow bake for the photoresist pattern after the cross-linking.

9 Claims, 6 Drawing Sheets

METHOD OF FORMING SEMICONDUCTOR DEVICE PATTERN INCLUDING CROSS-LINKING AND FLOW BAKING A POSITIVE PHOTORESIST

CROSS-REFERENCES TO RELATED APPLICATIONS

The present application claims priority under 35 U.S.C. §120 as a continuation-in-part of U.S. Ser. No. 09/110,964 filed Jul. 7, 1998, now abandoned which is hereby incorporated by reference in its entirety. The present application further claims priority under 35 U.S.C. §119 to Korean Patent Application Nos. 98-3252, 98-10172, 98-13856, 98-26680, and 98-31545 filed on Feb. 5, Mar. 24, Apr. 17, Jul. 2, and Aug. 3, 1998, respectively, the entire contents of all of which are hereby incorporated by reference.

BACKGROUND OF THE INVENTION

1. Field of the Invention

The present invention relates to a semiconductor device fabrication, and more particularly, a semiconductor device fabrication system and a method of forming a semiconductor device pattern using the same for providing a desired size of a semiconductor device pattern through the irradiation of Ultra Violet (UV) light on a photoresist pattern, and then, performing a flow process, and a photoresist for manufacturing semiconductor devices thereby.

2. Description of the Related Art

Generally, a semiconductor device is manufactured by an array of processes such as deposition, photolithography, etching, and ion-implantation, etc.

That is, a pattern of the semiconductor device is formed by depositing a polycrystalline film, an oxide film, a nitride film, and a metal film, etc. on a semiconductor wafer, and carrying out a photolithography process, an etching process, and an ion-implantation process, etc. thereon. The photolithography process has a significance in the semiconductor device fabrication process, in which a predetermined pattern for semiconductor device integrated circuits is formed on the wafer using a Photo Mask.

The photolithography process is used in various semiconductor device fabrication processes for 16M DRAM, 64M DRAM, and further 256M DRAM and 1G DRAM or higher according to the light source used in an exposure processing step. Currently used light sources for the photolithography process are g-line(436 nm), i-line(365 nm), DUV(248 nm) and KrF laser(193 nm), etc.

Photoresist used in the photolithography process is made of highly polymerized photo-sensitive substance solubility of which is changed by the chemical reaction with light.

That is, light is projected on the photo mask having micro-circuits preformed, and the photoresist substance of the light-incident portion is changed into more fusible substance or more infusible substance compared with the photoresist substance of the light-nonincident portion. Then, it is developed with an appropriate developer thereby forming positive or negative type photoresist pattern. The photoresist pattern made as above functions as a mask in the following processes after the photolithography process, such as etching and ion-implantation processes, etc.

The types of the photoresist are divided according to the exposure light source such as g-line, i-line, and DUV. However, the above photoresist generally has a difficulty in forming a photoresist pattern having a size shorter than the wavelength of the exposure light source.

Currently, the resolution of a contact hole pattern in the photolithography process is lower than that of a line & space pattern so that the pattern uniformity over all of the wafer surface is not good.

Therefore, there is a demand for new technology to allow the formation of the contact hole pattern having a size of 0.20 µm or less which is required for the highly-integrated semiconductor devices over 64M DRAM in order to overcome the limit resolution of the photoresist.

Currently, the method for forming the contact hole having a smaller size than the wavelength of the exposure light source is as follows.

First, as flow process method for a photoresist pattern, a normal photoresist pattern of contact holes having a size bigger than wanted is formed using a normal chromium (Cr) mask, and then, heat over the softening point of the photoresist is applied on the photoresist pattern so as to occur the softening of the highly polymerized photoresist and reduce its viscosity and flow it. As a result, the size of the photoresist pattern is reduced.

Second, as a modified exposure method, exposed portion and non-exposed portion are clearly defined by exposing using a modified illumination and a Phase Shift Mask (PSM). As a result, a photoresist pattern has a smaller size of contact hole than using a normal light and a photo mask.

The flow method by i-line photoresist including novolak resin, photo active compound (PAC), solvent and additives uses the speed difference due to the increase of thermal properties attributable to the pyrolysis of the PAC by heat and the Cross-Linking reaction of the resin and the PAC, and the photoresist pattern flow phenomenon by the decrease of the viscosity by heat.

The flow of the i-line photoresist proceeds with the Cross-Linking reaction, and the flow phenomenon is properly controlled by the Cross-Linking reaction. That is, because the flow phenomenon of the i-line photoresist gradually proceeds with the temperature changes, it is little affected by the temperature changes of the process and the facilities.

In case of the i-line photoresist, 0.25 µm of pattern can be obtained by the flow method. By applying a modified light and the PSM on the i-line photoresist, 0.28 µm of pattern can be achieved.

FIG. 1 shows the conventional pattern formation method for semiconductor devices, and in other words, shows a processing sequence of the contact hole formation method using the i-line photoresist.

Referring to FIG. 1, first, as step of coating a wafer with photoresist (S2), with the i-line photoresist is coated on the wafer having Hexamethyldisilazane (HMDS) pre-deposited thereon. Then, as step of soft-baking the photoresist (S4) on the wafer, the solvent included in the photoresist is removed by the soft bake so that the adhesiveness of the photoresist is improved, and the coating state of the photoresist on the wafer with a certain thickness is maintained. After the soft bake, as step of exposing after aligning a photo mask on the photoresist (S6), a wafer having the i-line photoresist thereon is moved to an i-line stepper, and the PSM having a fine pattern formed thereon is aligned over the wafer.

Then, the wafer having the photoresist thereon and the PSM aligned with the wafer is irradiated with an i-line light source so as to carry out the exposure. Then, as step of Post Exposure Bake (PEB) for the exposed wafer (S8), the wafer passing through the exposure is baked at a proper temperature so as to remove the wave pattern produced by standing wave phenomenon which occurs on the photoresist pattern during the reinforcement interference and the destruction interference by the incident light and the reflection light of the exposure light source, and improve the photoresist pattern profile, and further, improve the resolution of the photoresist pattern. Next, as step of the formation of the photoresist pattern by developing and cleaning the wafer passing through the PEB (S10), the wafer with the PEB completed is moved to a developing unit, a developer is supplied on the photoresist on the wafer so as to form a photoresist pattern, and the development by-products are removed using a cleaning solution.

Then, as step of hard bake for the developed wafer (S12), the photoresist pattern with the development completed is dried, and hardened so as to harden the photoresist pattern.

Then, as step of flow bake after the hard bake (S14), heat is applied on the photoresist pattern at a temperature over the softening point of the photoresist so as to reduce the softening and the viscosity of the highly-polymerized photoresist, and make the photoresist pattern flow thereby reducing the pattern size. However, in case of carrying out the flow method using the i-line photoresist and the PSM by a modified light, the photoresist pattern having 0.18 $\mu$m of resolution can be formed, but the thermal properties of the pattern of highly-polymerized photoresist becomes nonuniform because part of the non-exposure portion is exposed nonuniformly. That is, during the exposure for the photoresist pattern formation, the exposed amount on the Cell portion of high-density pattern and the Peri portion of low-density pattern, non-exposure portion respectively is nonuniform. As a result, the nonuniformity of the exposed amount results in a flow rate difference in the hardness by heat, and so, a Bulk effect of the distortion of the contact hole pattern occurs in the interface of the Cell portion and the Peripheral portion.

In the meantime, when using a DUV photoresist, the DUV photoresist is more sensitive to heat than the i-line photoresist, and also sensitive to the temperature uniformity of a bake oven used in the flow process. As a result, the flow occurs abruptly, and it is difficult to get uniform contact hole pattern overall on the wafer surface. That is, the flow process when using the DUV photoresist, and the i-line photoresist respectively is different. Therefore, the DUV photoresist is difficult to expect as same effect as the i-line photoresist because of the lack of the mechanism in which the Cross Linking reaction happens at a temperature of the flow start or at a lower temperature.

FIGS. 2 to 5 are cross-sectional views showing the processes for the contact hole pattern formation by flow method using the i-line photoresist and the PSM according to the process sequence of FIG. 1.

As shown in FIG. 2, i-line photoresist 6 is deposited over a wafer 2 having a certain sublayer-4 formed thereon, and then, the photoresist is soft-baked. Then, as shown in FIG. 3, the wafer 2 is moved to an i-line stepper, and the PSM 7 having the fine pattern formed thereon is aligned over the wafer 2 having the i-line photoresist 6 thereon. Then, the exposure is carried out for the wafer using the i-line light source.

Then, as shown in FIG. 4, the PEB is carried out on the exposed wafer 2, and developing and cleaning are carried out successively so as to form a first contact hole pattern 8. At this time, the size of the first contact hole pattern 8 is 0.25 $\mu$m. Then, as shown in FIG. 5, the first contact hole pattern 8 is flown and baked so as to form a second contact hole 9. However, in case of carrying out the flow using the PSM by the modified illumination, some of the non-exposure portion is nonuniformly exposed, and the thermal properties of the highly polymerized photoresist pattern becomes nonuniform. As a result, the flow rate difference occurs depending on the hardness by heat thereby causing a bulk effect, wherein the second contact hole 9 is distorted during the flow and bake, as shown in FIG. 5.

SUMMARY OF THE INVENTION

The present invention is directed to provide a semiconductor device fabrication system and a method of forming a semiconductor device pattern using the same, which substantially obviates one or more problems due to the limitations and the disadvantages of the related art.

One object of the present invention is to provide a method of forming a semiconductor device pattern through the formation of a uniform and a desired size of a contact hole pattern by allowing a flow method in case of using both of an i-line photoresist and a Phase Shift Mask (PSM).

Another object of the present invention is to provide a method of forming a semiconductor device pattern through the formation of a uniform and a desired size of a contact hole pattern by applying a flow method for a Deep Ultraviolet (DUV) photoresist.

Still another object of the present invention is to provide a semiconductor device fabrication system for the method of forming a semiconductor device pattern of the present invention.

Still another object of the present invention is to provide a photoresist being used in forming a semiconductor device pattern for manufacturing semiconductor devices.

To achieve these and other advantages and in accordance with the purpose of the present invention as embodied and broadly described, a semiconductor device fabrication system includes: a photoresist coating unit for coating a wafer with a specific photoresist; a developing unit for forming a photoresist pattern on the wafer coated with the photoresist; and a cross-linking unit for cross-linking the photoresist pattern to provide a stabilized flow during the flow process for the photoresist pattern.

The semiconductor device fabrication system may be one of a spinner and a track system.

The fabrication system for manufacturing semiconductor devices preferably further includes: a HMDS coating unit for increasing the adhesiveness of photoresist on the surface of a wafer transferred from a wafer loading unit before delivery of the wafer to the photoresist coating unit; a bake unit for baking the wafer having photoresist thereon, and passing the wafer through an exposure and a development; and a Wafer Edge Exposure (WEE) unit for exposing an edge portion of the wafer by a certain width.

The semiconductor device fabrication system preferably comprises at least one of the wafer loading unit, the HMDS coating unit, the photoresist coating unit, the coating unit, the bake unit, the Wafer Edge Exposure unit, and the cross-linking unit respectively.

Preferably, the soft bake unit of the semiconductor device fabrication system includes: a soft bake unit for removing solvent included in the photoresist on the wafer; a Post Exposure Bake (PEB) unit for removing fine standing waves present on the photoresist pattern; and a hard bake unit for hardening the photoresist pattern.

The cross-linking unit may be a UV bake unit for irradiating the developed wafer with UV light.

The UV bake unit includes: a UV lamp placed on the upper part of the UV bake unit, and producing UV light; and a hot plate placed on the lower part of the UV bake unit, and heating the wafer which is mounted at a distance away from the UV lamp. The UV lamp may be a Microwave-Excited Lamp or Mercury-Xenon Lamp.

In another aspect of the present invention, a semiconductor device fabrication system includes: a cross-linking unit for cross-linking a photoresist pattern on a wafer having passed through development to provide a stabilized flow during the flow process for the photoresist pattern; and a process chamber for carrying out an etching process for a sublayer on the wafer using the photoresist pattern as an etch mask, the position of the process chamber in the system facilitating transfer of the wafer between the cross-linking unit and the process chamber.

The fabrication system for manufacturing semiconductor devices of the present invention further comprises a load lock chamber connecting the cross- linking unit and the process chamber.

The cross-linking unit may be a UV bake unit for irradiating the developed wafer with UV light.

The UV bake unit includes: a UV lamp placed on the upper part of the UV bake unit, and producing a UV light; and a hot plate placed on the lower part of the UV bake unit, and heating the wafer which is mounted with a distance from the UV lamp.

In another aspect of the present invention, a method of forming a semiconductor device pattern includes: a) coating a wafer with a photoresist; b) aligning a photo mask on the photoresist, and carrying out an exposure; c) forming a photoresist pattern on the wafer; d) carrying out a cross-linking of the photoresist pattern; and e) carrying out a flow bake for the photoresist pattern after the cross-linking.

The photoresist is preferably for i-line or Deep Ultraviolet (DUV), and the photo mask uses a Phase Shift Mask (PSM) in case of using the i-line photoresist.

The i-line photoresist is preferably a positive photoresist including a base resin, a photo active compound(PAC), and a solvent, and, as an additive for activating the Cross Linking reaction of the photoresist pattern, 2,4,6-triamino-1,3,5-triazine is added.

The photoresist pattern may be a contact hole pattern, and the cross-linking may be a UV-bake of the photoresist pattern.

Preferably, the UV bake includes irradiating the photoresist pattern with UV light and performing a bake process of heating the photoresist pattern simultaneously.

The method may include hard-baking prior to the UV bake. Preferably, the heating provides heat between 50 to 140° C., and the step of irradiating UV light is carried out for 10 to 80 sec. A process temperature of the flow bake may range from 140 to 200° C., and a process time for the flow bake ranges from 80 to 120 sec. The flow bake is preferably carried out at least one time repeatedly.

The cross-linking may include: a) hard-baking the photoresist pattern; and b) carrying out a development for the photoresist pattern passing through the hard-bake.

The development for the photoresist pattern passing through the hard-bake may be carried out at least two times repeatedly.

In another aspect of the present invention, i-line photoresist is a positive photoresist, including a base resin, a photo active compound(PAC), and a solvent. As an additive for activating the Cross Linking reaction of the photoresist pattern, 2,4,6-triamino-1,3,5-triazine can be added.

Here, the amount of the 2,4,6-triamino-1,3,5-triazine is preferably between 0.001 to 5 weight percent for the whole amount of the base resin, the photo active compound(PAC), and the solvent.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be described with reference to the drawings, in which.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

According to the present invention, a fabrication system for semiconductor devices and a method of forming a pattern of semiconductor devices using the same are provided, wherein a photoresist pattern on a semiconductor wafer is irradiated with UV light after the developing process in the photolithography in order to make less critical dimension so that the distortion of the photoresist pattern during a flow process is prevented, and a desired pattern size can be effectively achieved.

Now herein after, a detailed description of one embodiment of the present invention is made.

Figure 1:
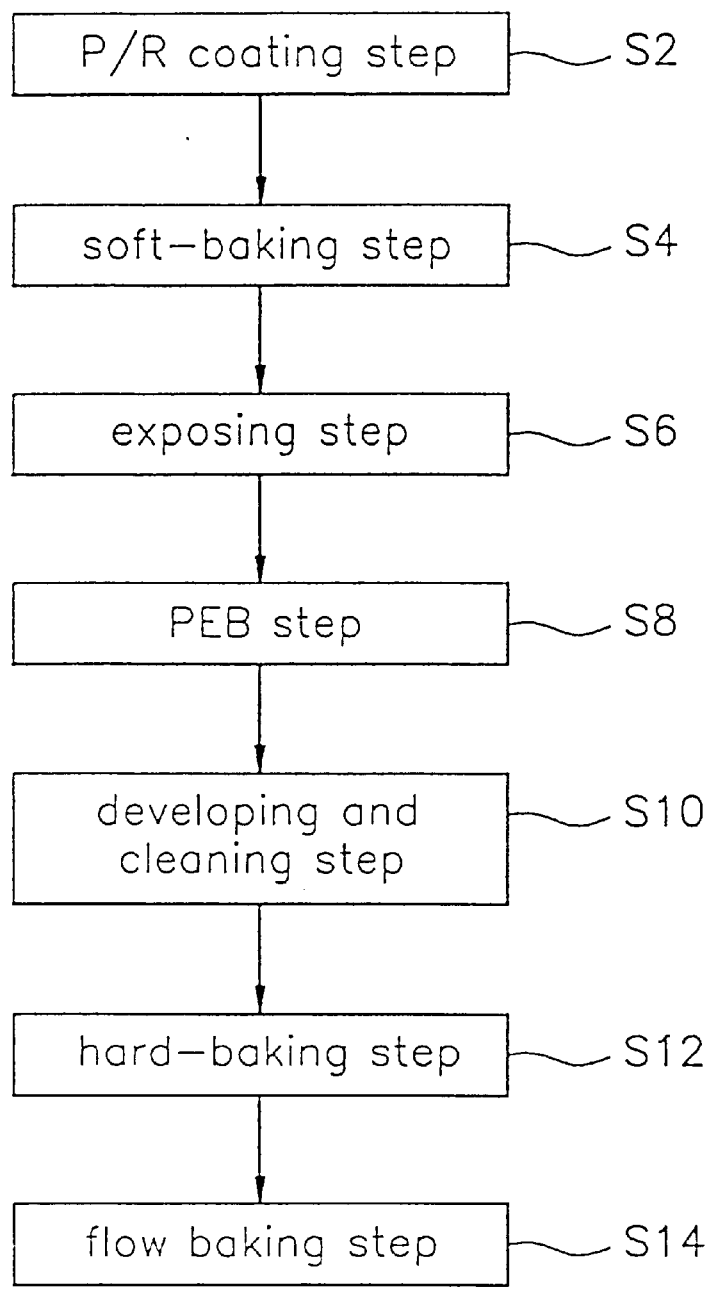
FIG. 1 shows a conventional process sequence for the pattern formation of semiconductor devices.
Figure 2:
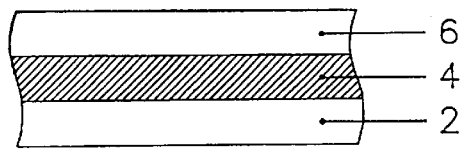
FIG. 2 to 5 are cross-sectional views showing the pattern formation of semiconductor devices according to the process sequence of FIG. 1.
Figure 3:
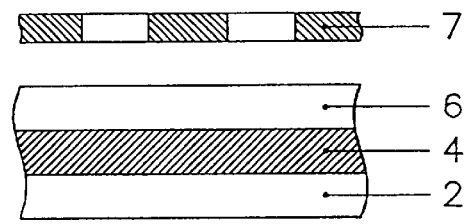
Figure 4:
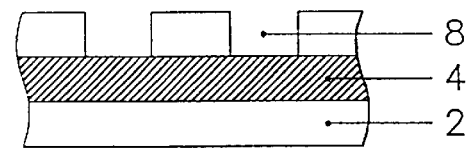
Figure 5:
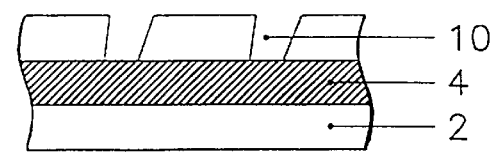
Figure 6:
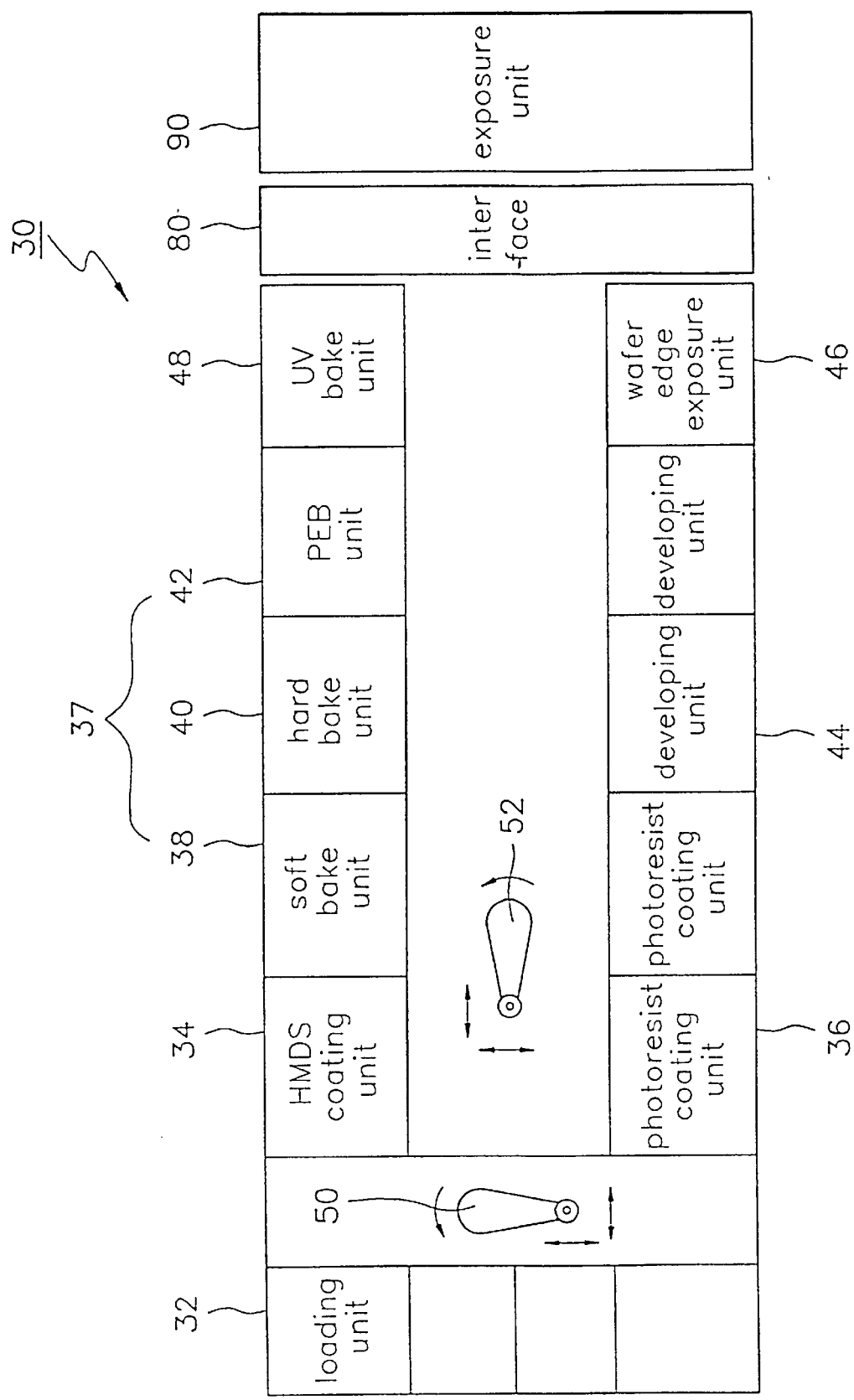
FIG. 6 is a block diagram showing one embodiment of a fabrication system of semiconductor devices according to the present invention.
Figure 7:
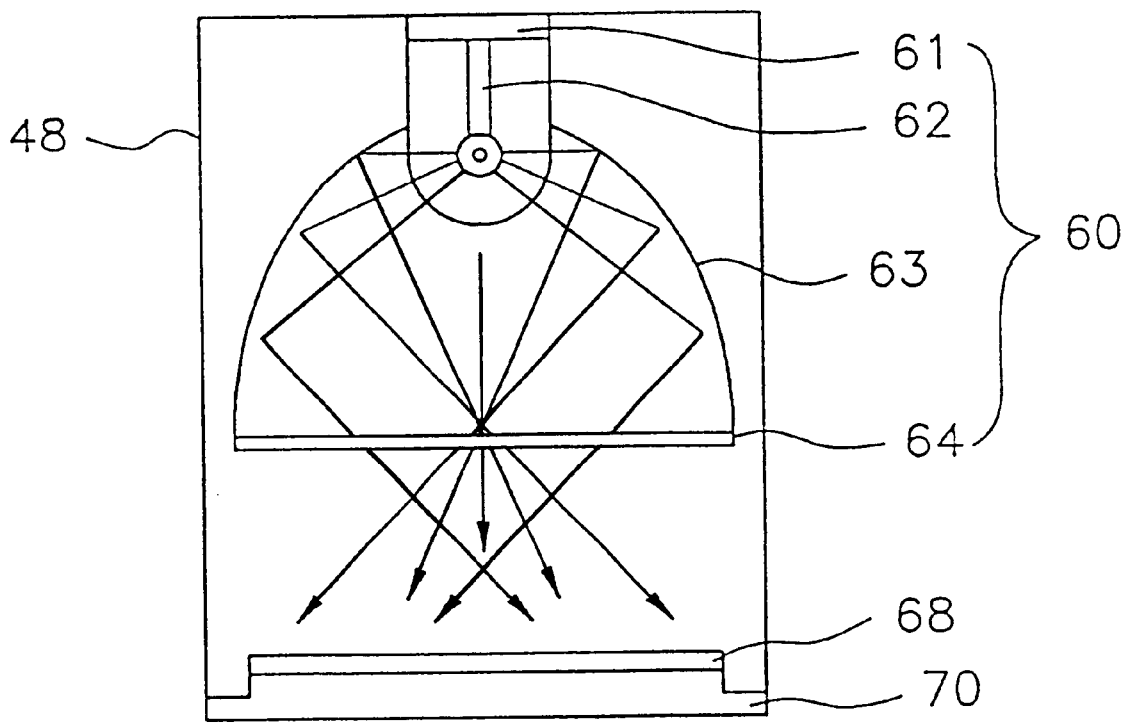
FIG. 7 is a sectional view showing a UV bake unit in the fabrication system of semiconductor devices of FIG. 6.

FIG. 6 is a block diagram showing one embodiment of a fabrication system of semiconductor devices according to the present invention, and FIG. 7 is a cross sectional view showing the UV bake unit equipped with a microwave-excited lamp of FIG. 6.

FIG. 6 shows that a semiconductor device fabrication system 30 and an exposure apparatus 90 are in-line connected via an interface unit 80.

The semiconductor device fabrication system 30 includes: a wafer loading unit 32 loading wafer cassettes having wafers therein; a HMDS coating unit 34 for increasing the adhesiveness of photoresist on the surface of the wafers transferred from the wafer loading unit 32; a photoresist coating unit 36 for coating the wafer having HMDS thereon with photoresist; a developing unit 44 for forming a photoresist pattern after coating the wafer with photoresist in the photoresist coating unit 36, the exposure of the photoresist on the wafer, and the development of the exposed wafer; a bake unit 37 comprising a soft bake unit 38 for removing the solvent in the wafer having photoresist thereon, a PEB unit 42 for removing the fine standing wave present on the photoresist pattern after the exposure of the wafer having the photoresist thereon, and a hard bake unit 40 for hardening the photoresist pattern; and a UV bake unit 48 as cross-linking unit for irradiating the developed wafer with UV light for Cross Linking reaction, and providing a stabilized flow during the flow process of the photoresist pattern.

The semiconductor device fabrication system may be one of a spinner and a track system, and in the semiconductor device fabrication system, preferably, a wafer edge exposure unit 46 is further installed for exposing a certain width of wafer edge portion. For the effective multi processes of the semiconductor device fabrication using the semiconductor device fabrication system, the wafer loading unit 32, the HMDS deposition unit 34, the photoresist loading unit 36, and the development unit 44, the soft bake unit 38, the PEB unit 42, the hard bake unit 40, and the UV bake unit 48 are preferably installed with number of at least one respectively, i.e., multiple number of respective units.

The UV bake unit 48 includes a UV lamp being installed in the upper part of the chamber for providing a UV light, and a hot plate being installed in the lower part of the chamber for mounting a wafer with a distance from the UV lamp and heating the wafer. The UV lamp is preferably a microwave-excited lamp or a mercury xenon arc lamp.

Referring to the UV bake unit 48 having the microwave-excited lamp 60, the UV bake unit 48 includes: the microwave-excited lamp 60 including a mercury bulb 62 having a ultra high frequency guide 61, a reflection mirror 63 for covering the mercury bulb 62 and focusing the UV light generated from the mercury bulb 62 by ultra high frequency wave applied by the ultra high frequency guide 61 toward a wafer, and a quartz plate placed under the reflection mirror 63; and a hot plate 70 for mounting a wafer 68 with a distance from the microwave-excited lamp 60, and heating the wafer 68.

If the wafer 68 is mounted on the hot plate 70, the ultra high frequency guide 61 applies energy on the mercury bulb 62 having mercury therein and the mercury is turned into plasma state so as to generate a UV light. The reflection mirror 63 reflects the UV light scattered in various direction so as to reach it to the wafer 68 efficiently.

The description of the operation of the semiconductor device fabrication system 30 according to the present invention is made. First, when a cassette having a wafer therein is loaded in the wafer loading unit 32, the wafer is transferred to the HMDS deposition unit 34 by a first transfer arm 50. A certain thickness of HMDS is deposited on the wafer inside the HMDS deposition unit 34 in order to efficiently coat the wafer with photoresist. Then, the wafer with the HMDS thereon is transferred to the photoresist coating unit 36 by a second transfer arm 52 so that the wafer surface is coated with a specific photoresist for a specific process. The transfer arms 50, 52 are just illustrated in order to explain one embodiment of the present invention, which are not limited to the present invention as well known to those skilled in this art.

Then, the wafer having the photoresist thereon is transferred into the soft bake unit 38, and is baked at a certain temperature so as to remove the solvent included in the photoresist, and make a sure that the coating state is maintained with a certain thickness coating.

Then, the soft-baked wafer is transferred through the interface 80 into the exposure system 90 for the exposure. The exposed wafer passes through the wafer edge exposure unit 46 and transferred into the PEB unit 42 in order to improve the pattern profile by removing the wave pattern generated by the standing wave effect occurred on the photoresist pattern due to the reinforcement interference and the destruction interference by the incident light and the reflection light of the exposure light source after baking at a certain temperature and the developing.

Then, the wafer with the PEB completed is transferred into the development unit 44, and the developer is sprayed on the wafer surface so as to form a positive or negative photoresist pattern by the exposure. At this time, the critical dimension of the photoresist pattern is larger than desired.

Then, the wafer is transferred into the UV bake unit 48, and UV light irradiation on the photoresist pattern and the bake process on the hot plate are carried out so as to cause the Cross Linking reaction inside the photoresist and the flow process simultaneously, and thereby achieve the smaller size of photoresist pattern than pattern after the development. Each unit of the above semiconductor device fabrication system can be aligned differently for convenience, and the processing units may be aligned vertically in order to increase the efficiency of the occupancy area inside the Fab. line for the semiconductor device fabrication process, which is apparent to those skilled in this art.

An important feature of the present invention is to provide the UV bake unit 48 in the conventional spinner or track system, but the location of the UV bake unit 48 is not limited to those set forth herein. The UV bake unit 48 is preferably installed close to the development unit 44 because the UV bake is carried out after the development in the process sequential order.

The wafer having the photoresist pattern formed thereon passes through the semiconductor device fabrication system having the UV development unit 48, and is transferred into an etch system for the subsequent process. Then, the device pattern is formed by etching a sublayer on the wafer using the photoresist pattern as etch mask.

As described above, the device pattern formation is made out after carrying out the UV bake and the flow bake on the photoresist pattern formed by the development, and etching the sublayer. The etch system equipped with the UV bake unit therein can be used.

Therefore, the etch system may be constructed to include the UV bake unit for irradiating UV light on the wafer, and providing a stabilized flow process for the photoresist pattern, and a process chamber installed adjacent to the UV bake unit for etching the sublayer on the wafer by using the photoresist pattern. Preferably, a load lock chamber is installed connecting the UV bake unit and the process chamber.

Figure 8:
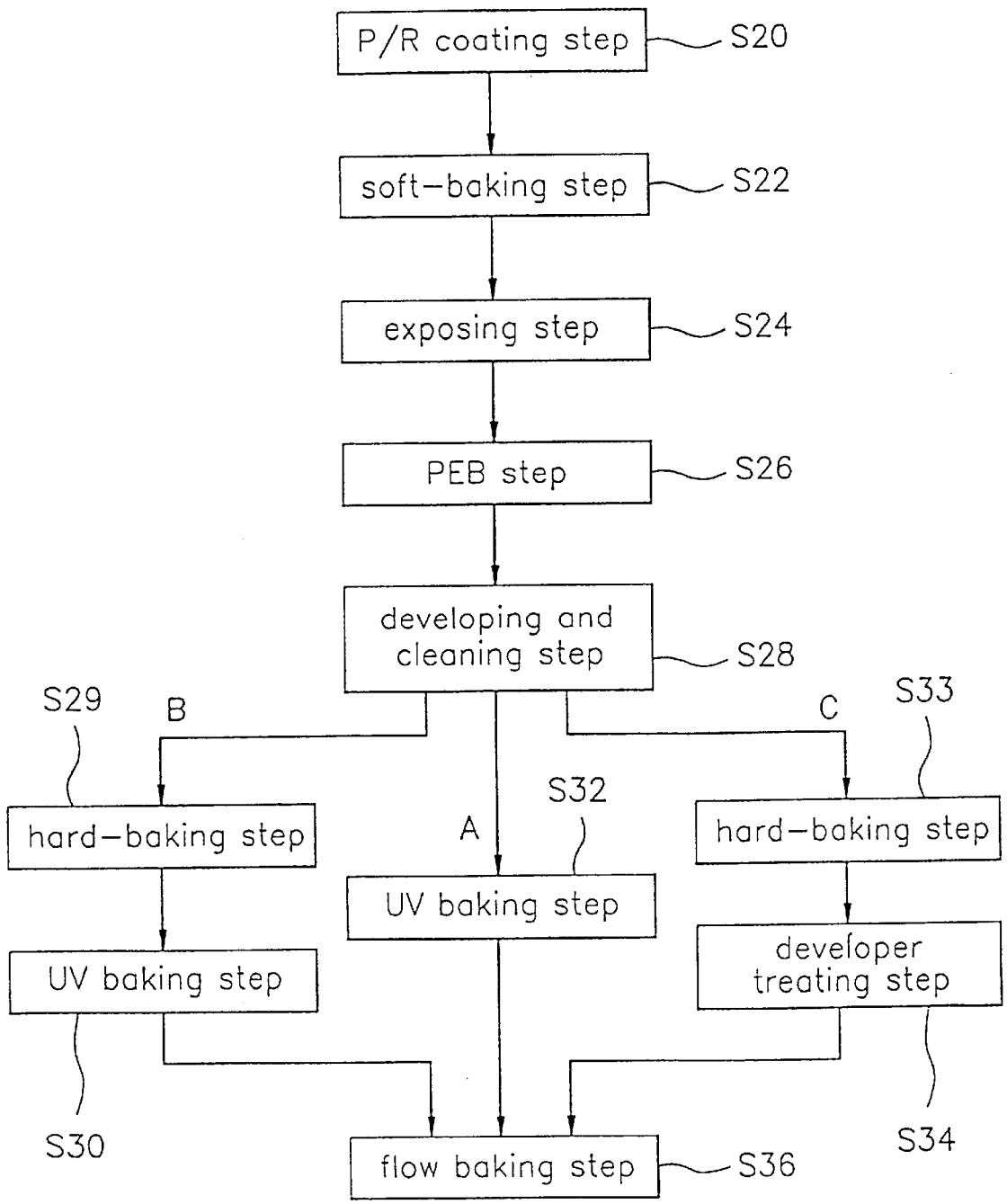
FIG. 8 is a process sequence showing the pattern formation of semiconductor devices according to one embodiment of the present invention.

FIG. 8 is a process sequence showing the pattern formation of semiconductor devices according to one embodiment of the present invention. As shown in FIG. 8, the photoresist pattern can be formed after the development and the cleaning and selecting either one among the following three orders.

The three processing orders are designated as A, B, and C. After describing the A order, the B and C order are described, but the description of the same procedures present in the A order is omitted.

First, describing the A process order, the wafer is coated with photoresist (S20), e.g., an i-line photoresist. Then, the photoresist on the wafer is soft-baked (S22), the solvent in the photoresist is removed by the soft-bake, and the adhesiveness of the i-line photoresist is improved, as well.

Here, the i-line photoresist is preferably a positive photoresist including a base resin, a photo active compound (PAC), and a solvent. As an additive for activating the Cross Linking reaction of the photoresist pattern, 2,4,6-triamino-1,3,5-triazine can be added, wherein its added weight percent may be between 0.001 to 5 weight percent for the whole amount of base resin, photo active compound(PAC), solvent. The 2,4,6-triamino-1,3,5-triazine is so-called a melamine, and its chemical formula is $C_3H_6N_6$, and it forms melamine formaldehyde resin by addition-condensation reaction with formaldehyde.

Then, the photo mask is aligned with the photoresist having the soft-bake completed and the photoresist is exposed (S24), the wafer with the i-line photoresist deposited thereon is transferred into an i-line stepper, and the wafer is exposed by aligning the PSM having fine contact hole pattern formed thereon on the wafer, and irradiating the wafer with the i-line light through the PSM. Then, the PEB for the exposed wafer (S26) is carried out for improving the pattern profile and the resolution of the photoresist pattern by removing the wave pattern present on the wafer surface generated due to the standing wave by the reinforcement interference and the destruction interference of the incident light and the reflection light from the light source.

Then, the wafer with the PEB completed thereon is developed and cleaned, and the photoresist pattern is formed (S28). That is, the wafer after the PEB is moved into the development system, the developer is supplied on the photoresist, the photoresist pattern is formed, and then, the development by-products are removed using cleaning solution.

Then, the photoresist pattern is UV baked (S32), the photoresist pattern is irradiated with a UV light applying heat, and Cross Linking reaction occurs inside the photoresist so that the thermal stability of the photoresist pattern is improved, and the photoresist pattern is maintained in a stable state during the temperature increase during the flow process. The UV bake process comprises the irradiation of the UV light on the photoresist pattern, and the application of heat, which occur simultaneously. Alternatively, the heat can be independently applied after the irradiation of the UV light.

Then, after the UV bake, the photoresist pattern is flow-baked (S36) by applying the heat on the photoresist pattern at a temperature over the softening point of the photoresist in order to decrease the softening and the viscosity of the highly polymerized photoresist, and flow the photoresist pattern thereby making the pattern size for the contact holes smaller. In addition, the flow difference between the high density pattern Cell portion and the low density pattern Peripheral portion becomes narrow so that the photoresist pattern can be formed on the wafer uniformly.

Alternatively, the B process order further includes hard-baking (S30) on the photoresist pattern before the UV bake thereon (S32) in the A process order in order to provide more stabilized flow process.

Finally, in the C process order, the UV baking (S32) in the A process order is omitted, wherein the photoresist pattern is UV-baked in order to provide the thermal stability of the photoresist pattern by the Cross-Linking reaction inside the photoresist and make the photoresist less sensitive to the temperature increase during the flow process. Instead of the UV bake (S32), a hard bake (S33) and a developer treatment (S34) are carried out successively, wherein the hard-baked wafer is treated with the same developer used in the preceding development (S28). That is, in the C process order, the photoresist pattern formed by the development process is treated with developer so as to change the properties of the photoresist and achieve the properties identical to the properties achieved in the above UV bake.

FIGS. 9 to 12 are cross-sectional views showing the contact hole pattern formation by the flow method using the i-line photoresist and the PSM of the FIG. 8, and it illustrates the A process in particular.

Figure 9:
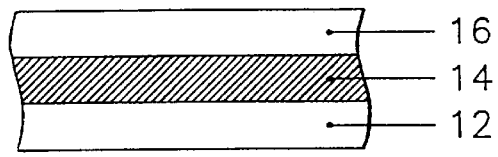
FIG. 9 to 12 are cross-sectional views showing the pattern formation of semiconductor devices according to the process sequence of FIG. 8.

As shown in FIG. 9, with an i-line photoresist 16 is coated the wafer 12 having a sublayer 14 formed on its surface, and it is soft-baked at a temperature of 80 to 120° C. for 50 to 100 sec. The soft-bake removes the solvent included in the i-line photoresist 16 so as to maintain the coating state of the i-line photoresist 16 with a certain thickness. The desirable process temperature of the soft bake is 90° C.

Here, the i-line photoresist is a positive photoresist, including a base resin, a photo active compound(PAC), and a solvent. As an additive for activating the Cross Linking reaction of the photoresist pattern, 2,4,6-triamino-1,3,5-triazine can be added, wherein its added weight percent may be between 0.001 to 5 weight percent for the whole amount of the base resin, the photo active compound(PAC), and the solvent.

Figure 10:
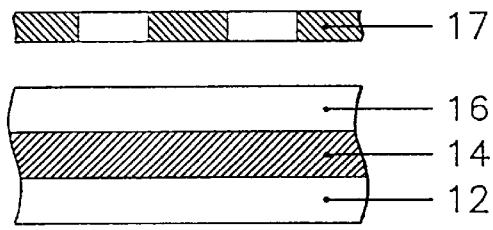

Then, as shown in FIG. 10, the wafer 12 is moved into an i-line stepper, and the PSM 17 having the fine contact hole pattern formed thereon is aligned on the i-line photoresist 16 so as to carry out the exposure using the i-line light.

Figure 11:
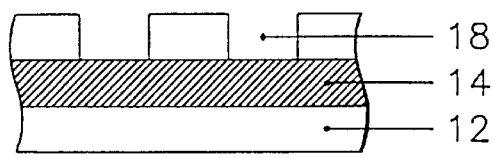

Then, as shown in FIG. 11, the PEB is carried out on the exposed wafer 12 at a temperature of 100 to 140° C. for 50 to 100 sec. Then, a developing and a cleaning process are carried out, and a first contact hole 18 is formed. The PEB is carried out in order to improve the pattern profile by removing fine standing waves present on the photoresist pattern, and improve the resolution of the pattern. At this time, the size of the first contact hole pattern 18 is 0.28 $\mu$m, and the uniformity of the first contact hole pattern 18 throughout the wafer surface 12 is not good.

Figure 12:
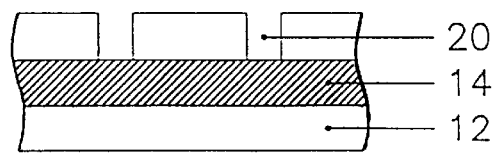

Then, as shown in FIG. 12, the UV bake and the flow bake are carried out successively on the first contact hole pattern 18 so as to form a second contact hole 20 having a smaller size of 0.20 $\mu$m than the first contact hole pattern 18. The UV bake is carried out on the first contact hole pattern 18 by applying heat simultaneously with the irradiation of the UV light.

The UV light irradiation is carried out for 10 to 80 sec., and preferably, for 10 to 50 sec. The temperature of the bake by heat is 50 to 140° C., and preferably, 110° C. That is, the first contact hole pattern 18 is thermally stabilized by the UV light irradiation and the bake, and the Cross Linking reaction occurs inside the first contact hole pattern 18.

Then, after the UV bake, the UV light irradiation stops, and the flow bake is carried out on the wafer in the same chamber or after being moved into a separate bake chamber at a temperature of 140 to 200° C. for 80 to 120 sec. As a result, a second contact hole 20 is formed. The preferable process temperature of the flow bake is 170 to 190° C. In the flow bake, it prevents a Bulk effect of the distortion of the photoresist pattern, which occurs due to the flow difference of the highly polymerized photoresist between the condensed pattern portion, and the little pattern portion. As a result, the second contact hole 20 having a smaller size than the wavelength of the exposure light, that is, 0.20 $\mu$m or less is uniformly formed throughout the wafer surface 12. The flow bake can be carried out at least one time according to the kinds of the photoresist and flow amount.

Accordingly, the characteristics of the semiconductor device fabrication system of the present invention is to further provide the conventional spinner or track system with the UV bake unit 48 as a cross-linking unit. In addition, by installing the UV bake unit 48 adjacent to the etch process chamber, the efficiency of the fabrication system is increased thereby activating the flow-bake process.

For the method of forming the semiconductor device pattern according to the present invention, i-line photoresist and DUV photoresist alike can be applicable. The photoresist are two types; negative, which becomes less soluble in a developer solution if exposed to light, and positive, which becomes more soluble if exposed to light. In case of the present invention, the i-line positive photoresist, which includes nobolak resin as the base resin, diazonaphtoquinone as the photo active compound added to polyhydroxy benzophenone as balast group, and 2-heptanone as solvent, and as the additive, 2,4,6-triamino-1,3,5-triazine, so called melamine, is added to the i-line positive photoresist so that the flow effect for the photoresist pattern is further improved.

Typically, the bake or UV light irradiation for positive photoresist generates acid to make the photoresist soluble in an irradiated area of the positive photoresist. Then, the addition of additives helps the cross linking reaction in the upper portion of the positive photoresist, and so, the Flow process of the present invention can be greatly improved. In other words, by adding the 2,4,6-triamino-1,3,5-triazine to the i-line positive photoresist, the Cross Linking reaction between the base resins under the acid catalyst reaction is further activated so that the thermal characteristics of the photoresist during the flow bake is improved.

Therefore, according to the present invention, a uniform photoresist pattern having a smaller size than the wavelength of the exposure light can be achieved by irradiating the photoresist pattern with the UV light after the formation of the photoresist pattern, and occurring the Cross Linking reaction on the highly polymerized photoresist in order to stabilize the photoresist thermally, and prevent the bulk effect which occurs during the next flow process. The bulk effect is the phenomenon of the distortion of the photoresist pattern due to the flow difference between the condensed pattern portion and the little pattern portion.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. A method of forming a semiconductor device pattern comprising:
    a) coating a wafer with a positive photoresist;
    b) aligning a photo mask on the positive photoresist, and carrying out an exposure;
    c) forming a photoresist pattern on the wafer;
    d) carrying out a cross-linking of the photoresist pattern by activating an additive in the positive photoresist, said cross-linking comprising
        hard-baking the photoresist pattern, and
        carrying out a development for the photoresist pattern passing through the hard-bake; and
    e) carrying out a flow bake for the photoresist pattern after the cross-linking, thereby reducing a critical dimension of the photoresist pattern.

2. The method of forming a semiconductor device pattern of the claim 1, wherein the photoresist is for i-line or Deep Ultraviolet (DUV).

3. The method of forming a semiconductor device pattern of the claim 2, wherein the photo mask uses a Phase Shift Mask (PSM) when using the i-line photoresist.

4. The method of forming a semiconductor device pattern of the claim 3, wherein the i-line photoresist is a positive photoresist comprising a base resin, a photo active compound(PAC), solvent, and, as an additive for activating the Cross Linking reaction of the photoresist pattern, 2,4,6-triamino-1,3,5-triazine is added.

5. The method of forming a semiconductor device pattern of the claim 1, wherein the photoresist pattern is a contact hole pattern.

6. The method of forming a semiconductor device pattern of the claim 1, wherein a process temperature of the flow bake ranges from 140 to 200° C.

7. The method of forming a semiconductor device pattern of the claim 6, wherein a process time for the flow bake ranges from 80 to 120 sec.

8. The method of forming a semiconductor device pattern of the claim 1, wherein the flow bake is carried out at least one time repeatedly.

9. The method of forming a semiconductor device pattern of the claim 1, wherein said carrying out a development for the photoresist pattern passing through the hard-bake is carried out at least two times repeatedly.

* * * * *